(12) United States Patent
Han

(10) Patent No.: US 7,826,289 B2
(45) Date of Patent: Nov. 2, 2010

(54) SEMICONDUCTOR MEMORY DEVICE AND METHOD FOR DRIVING THE SAME

(75) Inventor: Hi-Hyun Han, Kyoungki-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 212 days.

(21) Appl. No.: 11/967,501

(22) Filed: Dec. 31, 2007

(65) Prior Publication Data
US 2008/0247248 A1 Oct. 9, 2008

(30) Foreign Application Priority Data
Apr. 6, 2007 (KR) .................. 10-2007-0034209

(51) Int. Cl.
*G11C 7/00* (2006.01)
(52) U.S. Cl. .................. 365/203; 365/230.03
(58) Field of Classification Search ............... 365/203, 365/230.03
See application file for complete search history.

(56) References Cited

U.S. PATENT DOCUMENTS

| | | | |
|---|---|---|---|
| 6,205,069 B1 | 3/2001 | Kim | |
| 6,356,494 B2 | 3/2002 | Jang et al. | |
| 6,381,186 B1 * | 4/2002 | Okamura et al. | 365/201 |
| 6,418,073 B1 * | 7/2002 | Fujita | 365/203 |
| 6,529,423 B1 | 3/2003 | Yoon et al. | |
| 6,952,377 B2 | 10/2005 | Chung | |
| 7,009,899 B2 | 3/2006 | Lee | |
| 2007/0070746 A1 * | 3/2007 | Han | 365/203 |

FOREIGN PATENT DOCUMENTS

| | | |
|---|---|---|
| JP | 09-074337 | 3/1997 |
| JP | 2003-022676 | 1/2003 |
| KR | 2006-0008145 | 1/2006 |
| KR | 2006-0040109 | 5/2006 |
| KR | 2006-0040113 | 5/2006 |
| KR | 2006-0070755 | 6/2006 |

* cited by examiner

*Primary Examiner*—Son Dinh
*Assistant Examiner*—Nam Nguyen
(74) *Attorney, Agent, or Firm*—IP & T Group LLP

(57) ABSTRACT

A semiconductor memory device includes: a driving voltage supplying unit configured to detect a simultaneous activation of banks and selectively supply one of a high voltage and an external voltage lower than the high voltage as a driving voltage; a flag detecting unit configured to detect inputs of flag signals activated in response to an active command and generate a precharge control signal; and a signal generating unit configured to generate a bit line precharge signal swinging between the driving voltage and a ground voltage in response to the precharge control signal.

18 Claims, 6 Drawing Sheets

SEMICONDUCTOR MEMORY DEVICE AND METHOD FOR DRIVING THE SAME

CROSS-REFERENCE TO RELATED APPLICATIONS

The present invention claims priority of Korean patent application number 10-2007-0034209, filed on Apr. 6, 2007, which is incorporated by reference in its entirety.

BACKGROUND OF THE INVENTION

The present invention relates to a semiconductor memory device, and more particularly, to a semiconductor memory device that can stably precharge bit lines in a bank interleave mode.

FIG. 1 is a block diagram of a conventional semiconductor memory device.

Referring to FIG. 1, the conventional semiconductor memory device includes upper unit memory cell arrays 10, lower unit memory cell arrays 20, bit line sense amplifier arrays 30, and sub hole regions 40. The bit line sense amplifier array 30 is shared by the upper unit memory cell array 10 and the lower unit memory cell array 20 and senses and amplifies data of a selected array. The sub hole region 40 controls the driving of the bit line sense amplifier array 30.

FIG. 2 is a circuit diagram of the upper and lower unit memory cell arrays 10 and 20, the bit line sense amplifier array 30, and the sub hole region 40 in the conventional semiconductor memory device of FIG. 1.

Referring to FIG. 2, the upper and lower unit memory cell arrays 10 and 20 include a plurality of unit memory cells each having a capacitor C1 for storing data in a smallest unit, and a transistor TR1 for transferring the data stored in the capacitor C1 to a bit line pair BL and /BL in response to a voltage of a word line.

The bit line sense amplifier array 30 includes a bit line sense amplifier 31, a first transfer unit 32, a bit line precharge unit 33, upper and lower selectors 34 and 35, upper and lower equalizers 36 and 37, a driving voltage generator 38, and a driving line initializer 39. The bit line sense amplifier 31 senses and amplifies a voltage difference of the bit line pair BL and /BL. The first transfer unit 32 transfers data applied on the bit line pair BL and /BL to a data bus pair SIO and /SIO in response to a column select signal YI. The bit line precharge unit 33 precharges the bit line pair BL and /BL in response to a bit line precharge signal BLEQ. The upper selector 34 connects one of the upper unit memory cell arrays 10 to the bit line sense amplifier 31 in response to an upper bit line separate signal BISH, and the lower selector 35 connects one of the lower unit memory cell arrays 20 to the bit line sense amplifier 31 in response to a bit line separate signal BISL. The upper and lower equalizers 36 and 37 equalize the levels of the bit line pair BL and /BL in response to the bit line precharge signal BLEQ. The driving voltage generator 38 generates driving voltages RTO and SB of the bit line sense amplifier 31. The driving line initializer 39 precharges and equalizes the driving voltage lines in response to the bit line precharge signal BLEQ.

Further, a second transfer unit 52 transfers data applied on the data bus pair SIO and /SIO to a local data bus pair LIO and /LIO. A main amplifier 54 senses and amplifies the data applied on the local data bus pair LIO and /LIO and outputs the amplified data to a global data bus pair GIO and /GIO. The second transfer unit 52 and the main amplifier 54 are disposed within a peripheral region.

The block for generating the bit line precharge signal BLEQ will be described below in more detail.

FIG. 3 is a circuit diagram of a bit line precharge signal generator in the conventional semiconductor memory device of FIG. 1.

Referring to FIG. 3, the semiconductor memory device includes a precharge control signal generator 60 and a driver 70. The precharge control signal generator 60 is configured to receive flag signals LAX9A and LAXBC to output a precharge control signal BLEQB. The driver 70 is configured to drive the bit line precharge signal BLEQ in response to the precharge control signal BLEQB.

Upon operation of the semiconductor memory device, the precharge signal generator 60 deactivates the precharge control signal BLEQB to a logic high level when the flag signals LAX9A and LAXBC having information on the selection of the corresponding bank are activated. The driver 70 deactivates the bit line precharge signal BLEQ to a logic low level in response to the precharge control signal BLEQB.

The bit line pair BL and /BL becomes a floating state because the bit line precharge unit 33 is disabled in response to the bit line precharge signal BLEQ of the logic low level. The driving line initializer 39 sets the driving voltage lines RTO and SB to a floating state in response to the bit line precharge signal BLEQ.

When the flag signals LAX9A and LAXBC are deactivated, the precharge control signal generator 60 activates the precharge control signal BLEQB to a logic low level. The driver 70 activates the bit line precharge signal BLEQ to a logic high level in response to the precharge control signal BLEQB.

The bit line precharge unit 33 of FIG. 2 is enabled in response to the bit line precharge signal BLEQ of a logic high level and thus the bit line pair BL and /BL is maintained at a precharge voltage VBLP. The equalizers 36 and 37 of FIG. 2 controls the connection of the bit line pair in response to the bit line precharge signal BLEQ such that the same voltage level is maintained.

When an active command is inputted, the bit line precharge signal BLEQ makes the bit line pair BL and /BL and the data bus pair SIO and /SIO set to a floating state. Thus, the bit line sense amplifier can sense and amplify the data transferred from the unit memory cell array. Thereafter, when a precharge command is inputted, the bit line pair BL and /BL and the data bus pair SIO and /SIO are again maintained at the precharge voltage VBLP.

As described above, the bit line precharge signal BLEQ is a control signal for maintaining the bit line pair BL and /BL and the data bus pair SIO and /SIO at predetermined voltage levels when the semiconductor memory device is in a precharge mode. The initialization and floating driving of the driving voltage lines are performed using the same bit line precharge signal because the control timing of the driving voltage lines is identical to that of the bit lines.

The bit line precharge signal BLEQ is a signal that swings between a ground voltage VSS and an external voltage VDD or between the ground voltage VSS and a high voltage VPP. When separate driving voltages are used, the following problems may occur. It will be assumed herein that the high voltage VPP is approximately 3.2 V and the external voltage is approximately 1.8 V.

First, when the bit line precharge signal BLEQ swings up to the high voltage level, transistors inside the equalizers and the bit line precharge unit must be implemented with high-voltage transistors, i.e., thick transistors. The high-voltage transistors are used for preventing the damage of the transistors when the bit line precharge signal BLEQ rises up to the high voltage level.

The high-voltage transistors, however, have a limitation in that their precharge performance is degraded. More specifically, the high-voltage transistors generally have a threshold voltage higher than slim transistors and have a low current drivability. Further, when the high voltage is used, a level shifter is used for increasing the voltage level. Hence, a transfer timing of the bit line precharge signal BLEQ is delayed. When the level shifter is used, the transfer timing of the bit line precharge signal BLEQ is delayed by approximately 300 ps.

Meanwhile, when the bit line precharge signal BLEQ swings up to the external voltage level, the transistors inside the equalizers and the bit line precharge unit are implemented with slim transistors.

However, a speed when the bit line precharge signal BLEQ rises to a logic high level becomes slow. The reason for this is that the external voltage is relatively lower than the high voltage.

When a semiconductor memory device operating at a low power supply voltage VDD performs a bank interleave operation, an activation timing of the bit line precharge signal BLEQ may be delayed. In case where while driving the bit line sense amplifier array within a bank, a precharge command is inputted to another bank by the bank interleave operation, the bit line precharge signal BLEQ for performing the precharge operation on another bank is not stably generated because a large amount of external voltage is consumed in driving the bit line sense amplifier in the bank. In other words, because the external voltage is dropped due to the driving of the bit line sense amplifier, a stable external voltage cannot be obtained in generating the bit line precharge signal BLEQ.

When a stable precharge operation is not performed, the bit line pair has an abnormal level in a subsequent driving and thus data fail occurs.

SUMMARY OF THE INVENTION

Embodiments of the present invention are directed to providing a semiconductor memory device that can stably precharge bit lines in a bank interleave mode.

In accordance with an aspect of the present invention, there is provided a semiconductor memory device, including: a driving voltage supplying unit configured to detect a simultaneous activation of banks and selectively supply one of a high voltage and an external voltage lower than the high voltage as a driving voltage; a flag detecting unit configured to detect inputs of flag signals activated in response to an active command and generate a precharge control signal; and a signal generating unit configured to generate a bit line precharge signal swinging between the driving voltage and a ground voltage in response to the precharge control signal.

In accordance with another aspect of the present invention, there is provided a method for driving a semiconductor memory device, including: detecting a simultaneous activation of banks; selectively supplying one of a high voltage and an external voltage lower than the high voltage as a driving voltage according to the detection result; detecting inputs of flag signals activated in response to an active command to generate a precharge control signal; generating a bit line precharge signal swinging between the driving voltage and a ground voltage in response to the precharge control signal; and controlling a precharge driving of bit lines inside an activated bank in response to the bit line precharge signal.

In accordance with further another aspect of the present invention, there is provided a method for driving a semiconductor memory device, including: detecting a simultaneous activation of banks; and generating a precharge control signal having a high voltage level higher than an external voltage level when one of the banks is precharged.

DESCRIPTION OF SPECIFIC EMBODIMENTS

Hereinafter, a semiconductor memory device and a method for driving the same in accordance with the present invention will be described in detail with reference to the accompanying drawings.

Figure 1:
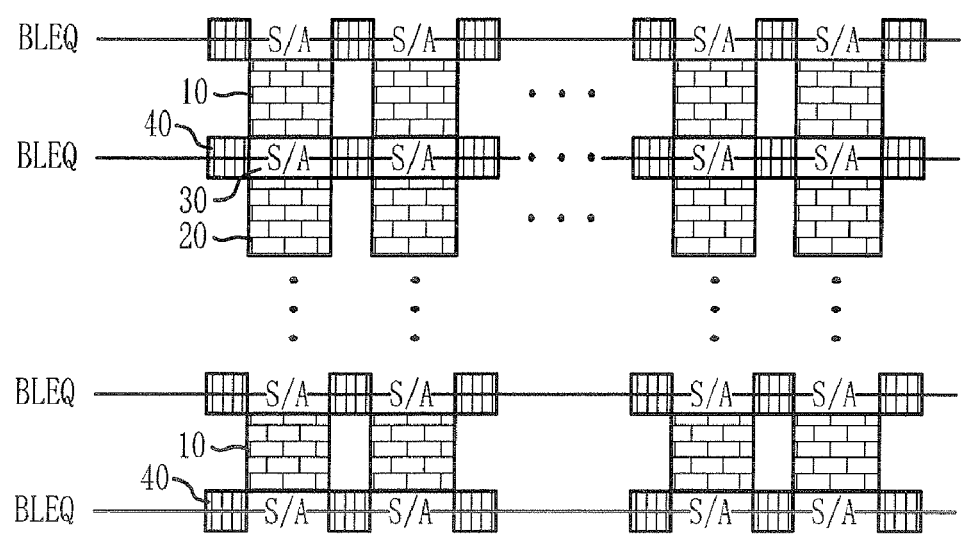
FIG. 1 is a block diagram of a conventional semiconductor memory device.
Figure 2:
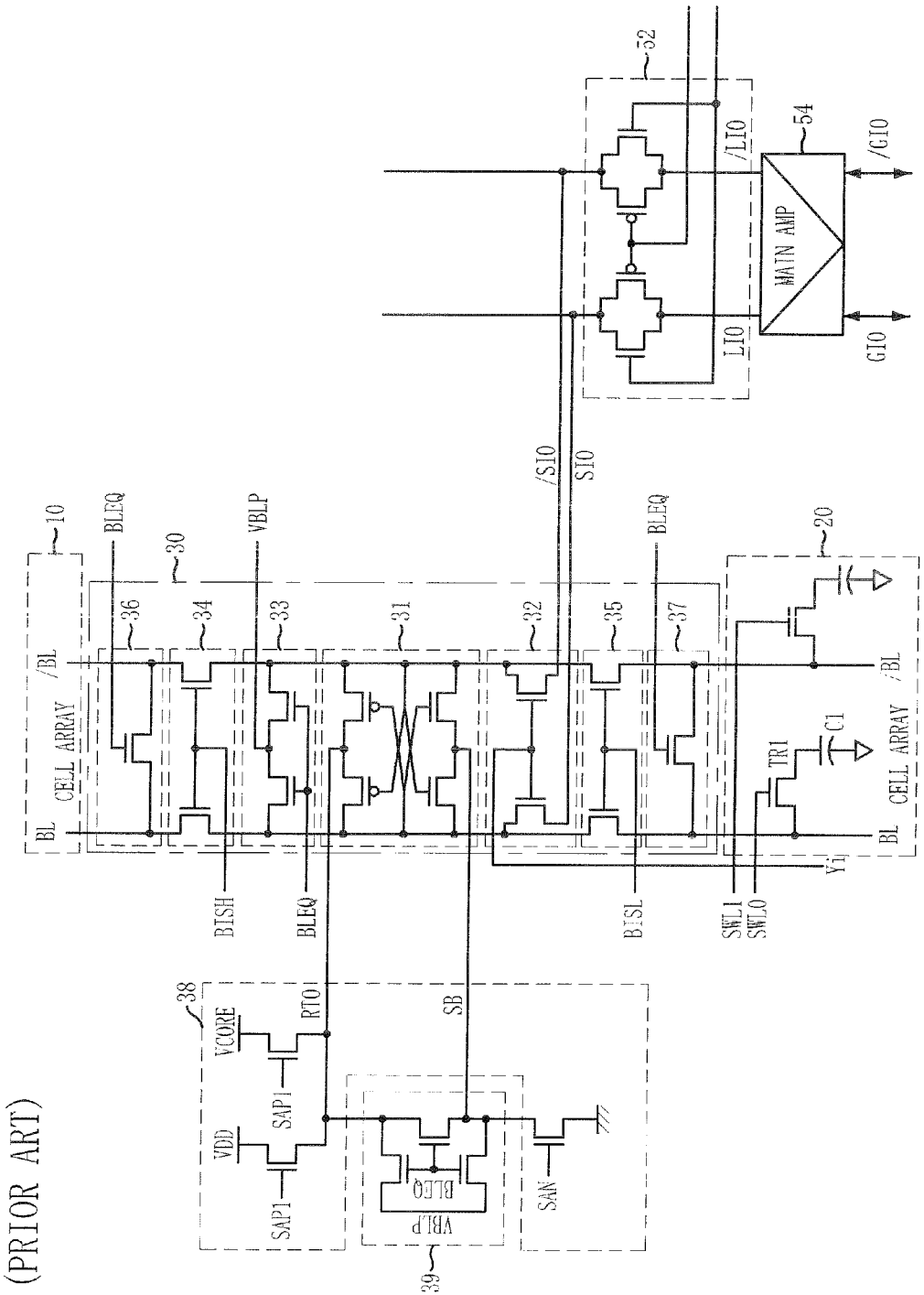
FIG. 2 is a circuit diagram of a unit memory cell array, a bit line sense amplifier array, and a sub-hole region in the conventional semiconductor memory device of FIG. 1.
Figure 3:
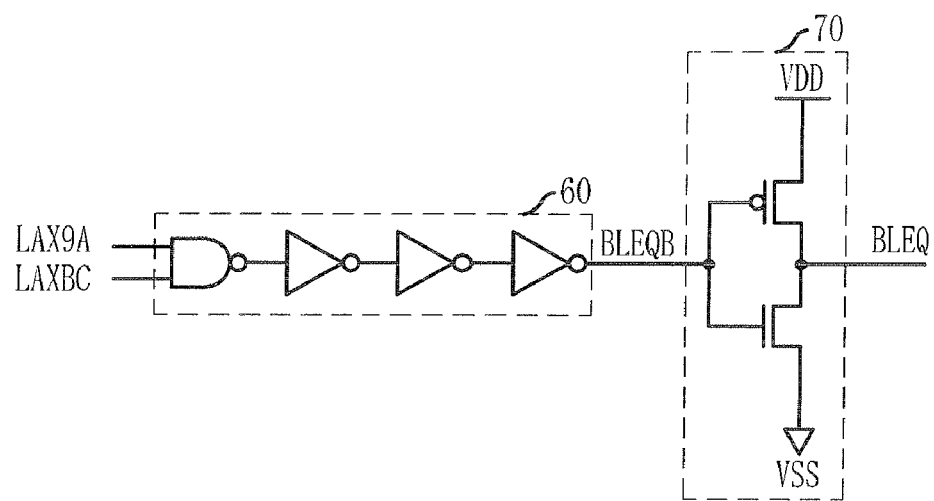
FIG. 3 is a circuit diagram of a bit line precharge signal generator in the conventional semiconductor memory device of FIG. 1.
Figure 4:
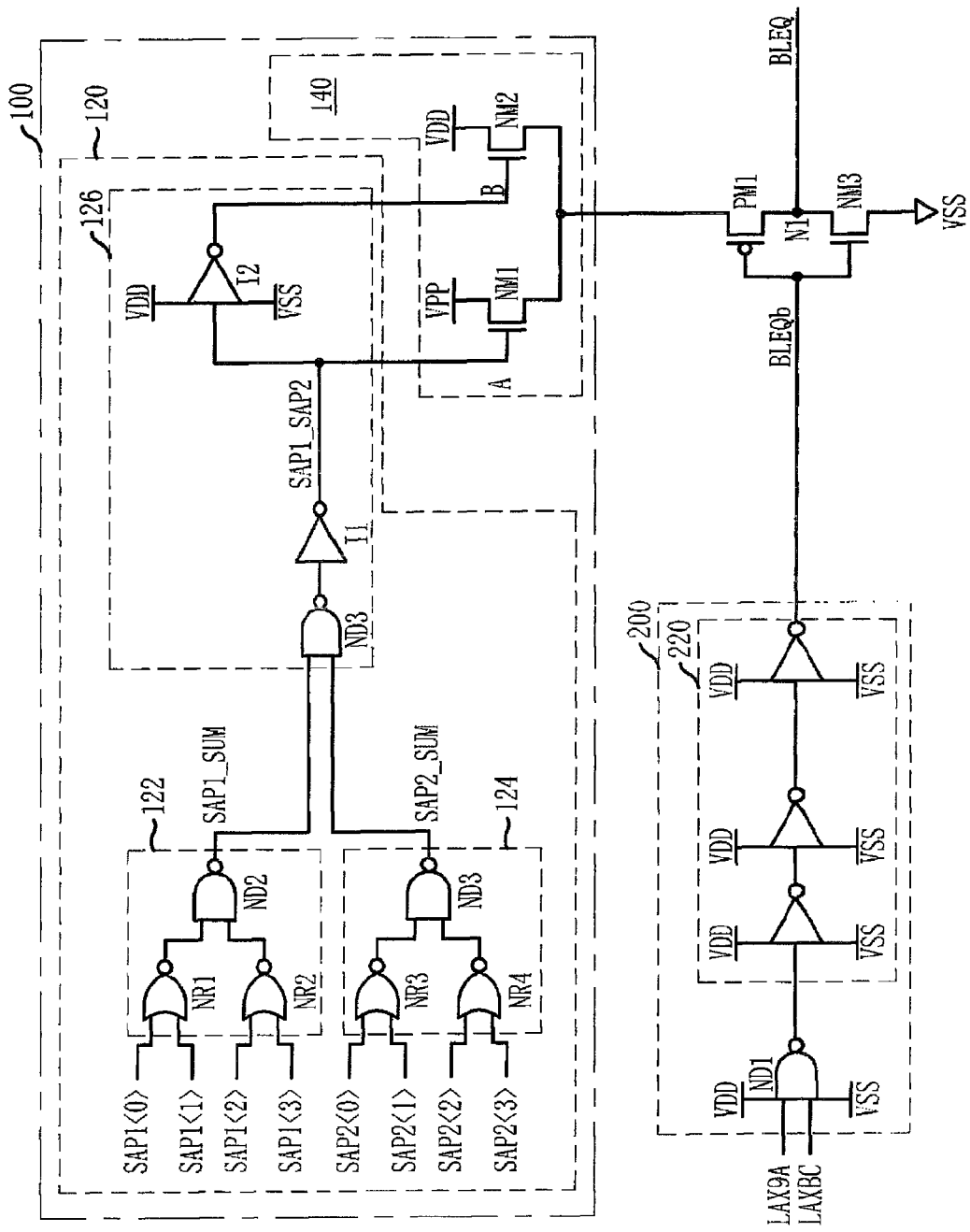
FIG. 4 is a circuit diagram of a bit line precharge signal generator in a semiconductor memory device in accordance with an embodiment of the present invention.

FIG. 4 is a circuit diagram of a bit line precharge signal generator in a semiconductor memory device in accordance with an embodiment of the present invention.

Referring to FIG. 4, the bit line precharge signal generator includes a driving voltage supplying unit 100, a flag detecting unit 200, and a signal generating unit 300. The driving voltage supplying unit 100 detects a simultaneous activation of banks and selectively supplies one of a high voltage VPP and an external voltage VDD as a driving voltage. The flag detecting unit 200 detects inputs of flag signals LAX9A and LAXBC to generate a precharge control signal BLEQB. The signal generating unit 300 generates a bit line precharge signal BLEQ swinging between the driving voltage and a ground voltage VSS in response to the precharge control signal BLEQB. Herein, the high voltage VPP has a voltage level higher than the external voltage VDD.

In a bank interleave mode, the simultaneous activation of the banks is detected (especially, the case where the bit line sense amplifier within one bank is overdriven and a precharge operation is performed on another bank), and the overdriving is performed using the high voltage VPP higher than the external voltage VDD in generating the bit line precharge signal BLEQ. Therefore, this can prevent a data fail that may occur when the bit line precharge signal BLEQ is not stably generated due to a level instability of the external voltage VDD in the simultaneous driving.

The driving voltage supplying unit 100 includes a driving detecting unit 120, and a voltage driving unit 140. The driving detecting unit 120 detects the driving of the bit line sense amplifier to output an overdriving signal A and a normal driving signal B. The voltage driving unit 140 supplies one of the high voltage VPP and the external voltage VDD as the driving voltage in response to the overdriving signal A and the normal driving signal B.

The driving detecting unit 120 includes an overdriving detector 122, a normal driving detector 124, and a driving signal generator 126. The overdriving detector 122 detects the overdriving of a plurality of bit line sense amplifiers to output a first detection signal SAP1_SUM. The normal driving detector 124 detects the normal driving of the plurality of bit line sense amplifiers to output a second detection signal SAP2_SUM. The driving signal generator 126 generates the overdriving signal A and the normal driving signal B in response to the first and second detection signals SAP1_SUM and SAP2_SUM.

The overdriving detector 122 includes a first NOR gate NR1 configured to receive a plurality of bit line overdriving signals SAP1<0> and SAP1<1>, a second NOR gate NR2 configured to receive a plurality of bit line overdriving signals SAP1<2> and SAP1<3>, and a first NAND gate ND2 configured to receive output signals of the first and second NOR gates NR1 and NR2 to output the first detection signal SAP1_SUM.

The normal driving detector 124 includes a third NOR gate NR3 configured to receive a plurality of bit line normal driving signals SAP2<0> and SAP2<1>, a fourth NOR gate NR4 configured to receive a plurality of bit line normal driving signals SAP2<2> and SAP2<3>, and a second NAND gate ND3 configured to receive output signals of the third and fourth NOR gates NR3 and NR4 to output the second detection signal SAP2_SUM.

The driving signal generator 126 includes a third NAND gate ND4 configured to receive the first and second detection signals SAP1_SUM and SAP2_SUM, a first inverter I1 configured to invert an output signal of the third NAND gate ND4 to output the overdriving signal A, and a second inverter I2 configured to invert the overdriving signal A to output the normal driving signal B.

The voltage driving unit 140 includes a first driver NM1 and a second driver NM2. The first driver NM1 supplies the high voltage VPP as the driving voltage in response to the overdriving signal A. The second driver NM2 supplies the external voltage VDD as the driving voltage in response to the normal driving signal B.

The first driver NM1 includes an NMOS transistor having a drain-source path connected between the high voltage (VPP) terminal and the driving voltage terminal, and a gate receiving the overdriving signal A. The second driver NM2 includes an NMOS transistor having a drain-source path connected between the external voltage (VDD) terminal and the driving voltage terminal, and a gate receiving the normal driving signal B.

The flag detecting unit 200 includes a fourth NAND gate ND1 configured to receive the flag signals LAX9A and LAXBC, and an inverter chain 220 configured to invert and delay an output signal of the fourth NAND gate ND1 to output the precharge control signal BLEQB.

The signal generating unit 300 includes a PMOS transistor PM1 having a source-drain path connected between the driving voltage terminal and an output terminal N1, and a gate receiving the precharge control signal BLEQB, and an NMOS transistor NM3 having a drain-source path connected between the output terminal N1 and the ground voltage (VSS) terminal, and a gate receiving the precharge control signal BLEQB. The signal generating unit 300 outputs a voltage of the output terminal N1 as the bit line precharge signal BLEQ.

Figure 5:
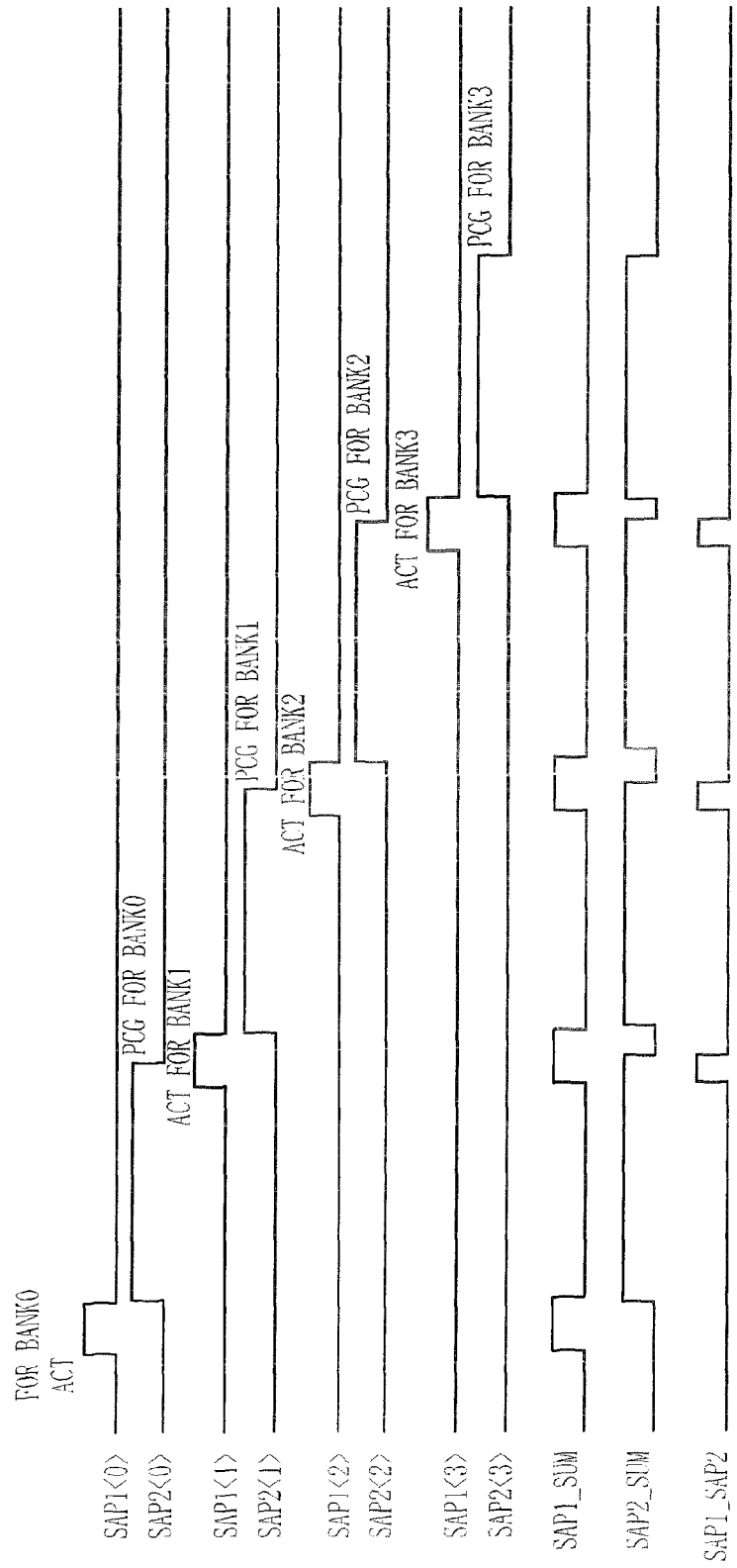
FIG. 5 is a timing diagram of signals used in a driving detecting unit of FIG. 4 in a bank interleave mode.

FIG. 5 is a timing diagram of signals used in the driving detecting unit 120 of FIG. 4 in the bank interleave mode.

Referring to FIG. 5, a first active command BANK0_ACT for activating a first bank BANK0 is inputted and data of the selected first bank BANK0 is sensed and amplified. In the early stage of the sense and amplification operation, the bit line overdriving signal SAP1<0> is activated to a logic high level. The overdriving detector 122 activates the first detection signal SAP1_SUM in response to the activation of the bit line overdriving signal SAP1<0>. However, because the second detection signal SAP2_SUM from the normal driving detector 124 is deactivated to a logic low level, the driving signal generator 126 deactivates the overdriving signal A to a logic low level and outputs only the normal driving signal B of a logic high level. Accordingly, the second driver NM2 drives the driving voltage terminal to the external voltage VDD in response to the normal driving signal B.

When the bit line overdriving signal SAP1<0> is deactivated by a first precharge command PCG_BANK0, the bit line normal driving signal SAP2<0> is activated.

The overdriving detector 122 deactivates the first detection signal SAP1_SUM in response to the deactivation of the bit line overdriving signal SAP1<0>, and the normal driving detector 124 activates the second detection signal SAP2_SUM to a logic high level in response to the bit line normal driving signal SAP2<0>.

The driving signal generator 126 deactivates the overdriving signal A to a logic low level and outputs only the normal driving signal B of a logic high level. Therefore, the second driver NM2 drives the driving voltage terminal to the external voltage VDD in response to the normal driving signal B.

While the precharge operation is performed on the first bank BANK0, a second active command ACT_BANK1 for activating a second bank BANK1 is inputted.

As described above, the bit line overdriving signal SAP1<1> is activated to a logic high level so as to sense and amplify data of the activated second bank BANK1. The overdriving detector 122 activates the first detection signal SAP1_SUM to a logic high level in response to the activation of the bit line overdriving signal SAP1<1>. At this point, the second detection signal SAP2_SUM is also maintained at a logic high level by the bit line normal driving signal SAP2<0> of the first bank BANK0.

The driving signal generator 126 activates the overdriving signal A to a logic high level in response to the first and second detection signals SAP1_SUM and SAP2_SUM of a logic high level, and deactivates the normal driving signal B to a logic low level.

Therefore, the first driver NM1 is activated and drives the driving voltage terminal to the high voltage VPP.

The operation of the driving voltage supplying unit 100 is identical to that described above, like an active operation of a third bank BANK2 during the activation of the second bank BANK1 and an active operation of a fourth bank BANK3 during the activation of the third bank BANK2.

That is, while the bit line sense amplifier inside one bank performs the overdriving operation, the driving voltage supplying unit 100 detects the precharge operation on another bank and overdrives the driving voltage to the high voltage VPP.

Figure 6:
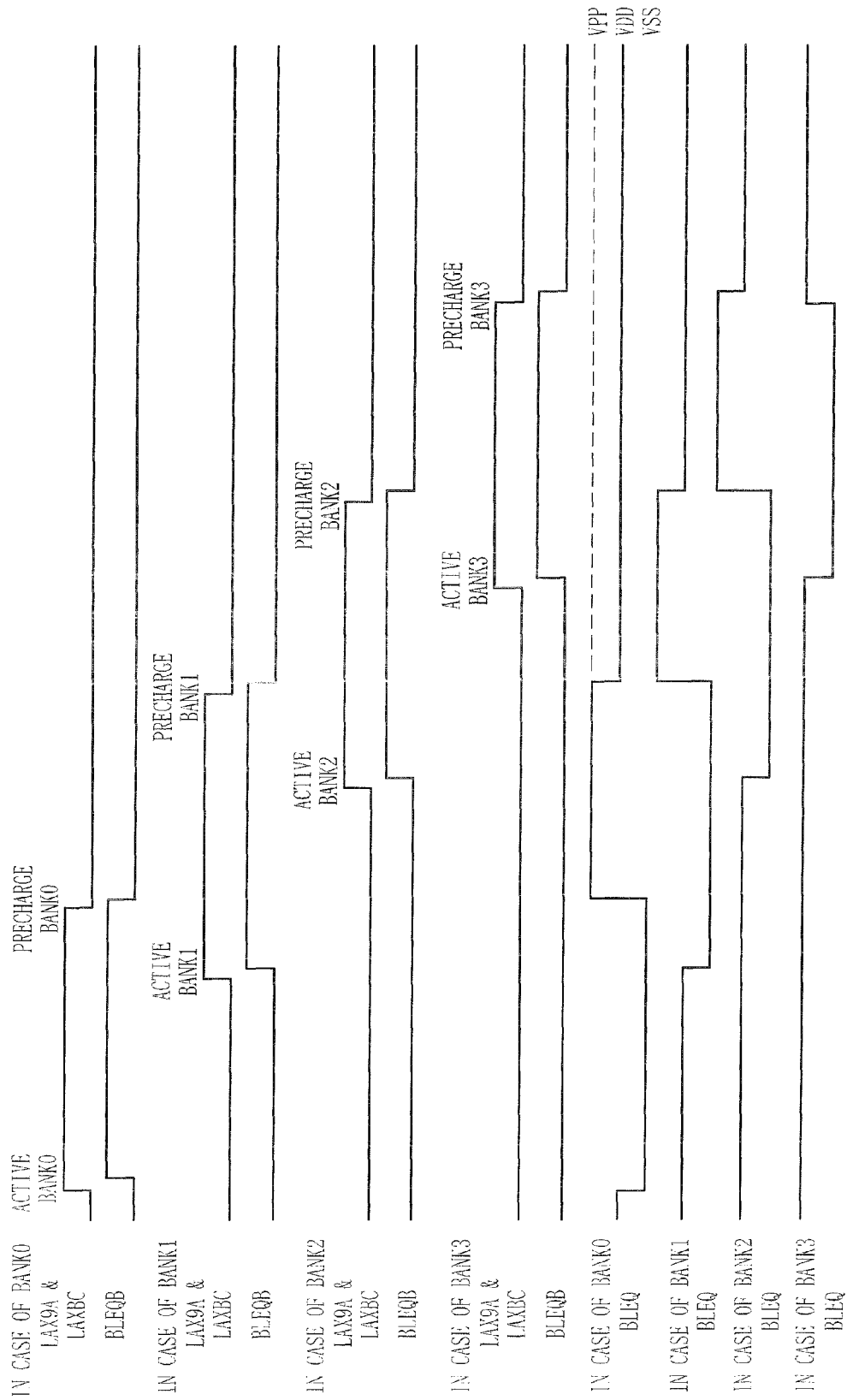
FIG. 6 is a timing diagram illustrating level variation of a bit line precharge signal.

FIG. 6 is a timing diagram illustrating level variation of the bit line precharge signal BLEQ.

Referring to FIG. 6, the flag signals LAX9A and LAXBC are activated to a logic high level in response to the first active command ACT_BANK0 for activating the first bank BANK0. Thereafter, the flag detecting unit 200 activates the precharge control signal BLEQB to a logic high level in response to the flag signals LAX9A and LAXBC. The signal generating unit 300 deactivates the bit line precharge signal BLEQ to a logic low level in response to the precharge control signal BLEQB.

Further, the bit line sense amplifier array is activated for sensing and amplifying the data of the activated first bank BANK0. As described with reference to FIG. 5, the driving detecting unit 120 activates only the normal driving signal B to a logic high level in response to the first active command ACT_BANK0. Therefore, the second driver NM2 applies the external voltage VDD as the driving voltage.

The flag signals LAX9A and LAXBC are activated to a logic high level in response to the second active command ACT_BANK1 for activating the second bank BANK1. Thereafter, the flag detecting unit 200 activates the precharge control signal BLEQB to a logic high level in response to the flag signals LAX9A and LAXBC. The signal generating unit 300 deactivates the corresponding bit line precharge signal BLEQ to a logic low level in response to the precharge control signal BLEQB.

Then, the first precharge command PCG_BANK0 for the first bank BANK0 is inputted and the flag signals LAX9A and LAXBC are deactivated. Therefore, the flag detecting unit 200 deactivates the precharge control signal BLEQB to a logic low level.

In this time, the bit line sense amplifier array is activated for sensing and amplifying the data of the activated second bank BANK1. As described with reference to FIG. 5, the bit line overdriving signal SAP1<1> is activated in response to the second active command ACT_BANK1. At this point, the bit line normal driving signal SAP2<0> of the first bank BANK0 is also activated. The driving detecting unit 120 activates the overdriving signal A to a logic high level during the section where the signals are overlapped. Therefore, the first driver NM1 applies the high voltage VPP as the driving voltage.

The signal generating unit 300 outputs the bit line precharge signal BLEQ having the high voltage (VPP) level in response to the precharge control signal BLEQB.

Thereafter, when the bit line overdriving signal SAP1<1> of the second bank BANK1 is deactivated to a logic low level according as the second bank BANK1 entries a precharge mode, the driving detecting unit 120 deactivates the overdriving signal A and activates the normal driving signal B to a logic high level. Then, the second driver NM2 supplies the external voltage VDD as the driving voltage in response to the normal driving signal B.

Therefore, the bit line precharge signal BLEQ applied to the bank BANK0 changes from the high voltage (VPP) level to the external voltage (VDD) level.

Even in the bank interleave mode in which the banks are simultaneously driven, the bit line precharge signal is overdriven to the high voltage level when the precharge driving of another bank different from the overdriving of the bit line sense amplifier is overlapped.

Therefore, the problem that the bit lines are not stably precharged due to the lowered level of the bit line precharge signal when the precharge operation is performed in the conventional overdriving can be solved by overdriving the bit line precharge signal. Consequently, the bit line precharge performance is improved in the bank interleave operation, thereby improving row precharge time (tRP) performance.

While the present invention has been described with respect to the specific embodiments, it will be apparent to those skilled in the art that various changes and modifications may be made without departing from the spirit and scope of the invention as defined in the following claims.

What is claimed is:

1. A semiconductor memory device, comprising:
   a driving voltage supplying unit configured to detect simultaneous activation of banks and selectively supply one of a high voltage and an external voltage lower than the high voltage as a driving voltage;
   a flag detecting unit configured to detect flag signals activated in response to a command, and generate a precharge control signal; and
   a signal generating unit configured to generate a bit line precharge signal swinging between the driving voltage and a ground voltage in response to the precharge control signal.

2. The semiconductor memory device as recited in claim 1, further comprising:
   upper and lower unit memory cell arrays configured to store data and apply the stored data in a bit line pair;
   a bit line sense amplifier array shared by the upper and lower unit memory cell arrays and configured to sense and amplify a voltage difference of the bit line pair; and
   a bit line precharge unit configured to precharge the bit line pair in response to the bit line precharge signal.

3. The semiconductor memory device as recited in claim 2, wherein the driving voltage supplying unit comprises:
   a driving detecting unit configured to detect driving of the bit line sense amplifier array to output an overdriving signal and a normal driving signal;
   a voltage driving unit configured to supply the driving voltage in response to the overdriving signal and the normal driving signal.

4. The semiconductor memory device as recited in claim 3, wherein the driving detecting unit comprises:
   an overdriving detector configured to detect an overdriving of the bit line sense amplifier array to output a first detection signal;
   a normal driving detector configured to detect a normal driving of the bit line amplifier array to output a second detection signal; and
   a driving signal generator configured to generate the overdriving signal and the normal driving signal in response to the first detection signal and the second detection signal.

5. The semiconductor memory device as recited in claim 4, wherein the overdriving detector comprises:
   a first logic gate configured to perform a NOR operation on first and second bit line overdriving signals for overdriving a corresponding bit line sense amplifier array;
   a second logic gate configured to perform a NOR operation on third and fourth bit line overdriving signals for overdriving a corresponding bit line sense amplifier array; and
   a third logic gate configured to perform a NAND operation on output signals of the first and second logic gates to output the first detection signal.

6. The semiconductor memory device as recited in claim 4, wherein the normal driving detector comprises:
   a first logic gate configured to perform a NOR operation on first and second bit line normal driving signals for normally driving a corresponding bit line sense amplifier array;
   a second logic gate configured to perform a NOR operation on third and fourth bit line normal driving signals for normally driving a corresponding bit line sense amplifier array; and
   a third logic gate configured to perform a NAND operation on output signals of the first and second logic gates to output the second detection signal.

7. The semiconductor memory device as recited in claim 4, wherein the driving signal generator comprises:
   a first logic gate configured to perform a NAND operation on the first and second detection signals;
   a second logic gate configured to invert an output signal of the first logic gate to output the overdriving signal; and a third logic gate configured to invert the overdriving signal to output the normal driving signal.

8. The semiconductor memory device as recited in claim 3, wherein the voltage driving unit includes:
   a first driver configured to supply the high voltage as the driving voltage in response to the overdriving signal; and
   a second driver configured to supply the external voltage as the driving voltage in response to the normal driving signal.

9. The semiconductor memory device as recited in claim 8, wherein the first driver comprises an NMOS transistor having a drain-source path connected between a high voltage terminal and a driving voltage terminal, and a gate receiving the overdriving signal.

10. The semiconductor memory device as recited in claim 8, wherein the second driver comprises an NMOS transistor having a drain-source connected between an external voltage terminal and a driving voltage terminal, and a gate receiving the normal driving signal.

11. The semiconductor memory device as recited in claim 2, wherein the flag detecting unit comprises:
   a first logic gate configured to perform a NAND operation on the first and second flag signals; and
   a second logic gate configured to invert and delay an output signal of the first logic gate to output the precharge control signal.

12. The semiconductor memory device as recited in claim 2, wherein the signal generator comprises:
   a PMOS transistor having a source-drain path connected between a driving voltage terminal and an output terminal, and a gate receiving the precharge control signal; and
   an NMOS transistor having a drain-source path connected between the output terminal and a ground voltage terminal, and a gate receiving the precharge control signal, wherein a voltage of the output terminal is outputted as the bit line precharge signal.

13. The semiconductor memory device as recited in claim 2, wherein the overdriving of the bit line sense amplifier array is performed using the external voltage, and the normal driving of the bit line sense amplifier array is performed using a core voltage having a voltage level lower than the external voltage.

14. A method for driving a semiconductor memory device, comprising:
   detecting simultaneous activation of banks;
   selectively supplying one of a high voltage and an external voltage lower than the high voltage as a driving voltage according to the detecting simultaneous activation;
   detecting flag signals activated in response to a command to generate a precharge control signal;
   generating a bit line precharge signal swinging between the driving voltage and a ground voltage in response to the precharge control signal; and
   controlling precharge driving of bit lines inside an activated bank in response to the bit line precharge signal.

15. The method as recited in claim 14, wherein the detecting of simultaneous activation of banks comprises:
   detecting overdriving of a bit line sense amplifier within a first bank;
   detecting a precharge driving within a second bank; and
   determining if the overdriving and the precharge driving are simultaneously detected, and outputting a detection signal.

16. The method as recited in claim 15, wherein the supplying of the driving voltage comprises:
   determining a logic level of the detection signal;
   supplying the high voltage as the driving voltage when the logic level is a first logic level; and
   supplying the external voltage as the driving voltage when the logic level is a second logic level.

17. A method for driving a semiconductor memory device, comprising:
   detecting an overdriving of a bit line sense amplifier within a first bank and a precharge driving within a second bank;
   determining if the overdriving and the precharge driving are simultaneously detected, and outputting a detection signal; and
   generating a precharge control signal having a high voltage higher than an external voltage when the second bank is precharged.

18. The method as recited in claim 17 wherein the generating of the control signal comprises:
   determining a logic level of the detection signal;
   generating the control signal using the high voltage as the driving voltage when the logic level is a first logic level; and
   generating the control signal using the external voltage as the driving voltage when the logic level is a second logic level.

* * * * *